(12) United States Patent
Cho

(10) Patent No.: US 6,720,802 B2
(45) Date of Patent: Apr. 13, 2004

(54) DATA OUTPUT BUFFER

(75) Inventor: Ho Youb Cho, Seoul (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 0 days.

(21) Appl. No.: 10/178,497

(22) Filed: Jun. 24, 2002

(65) Prior Publication Data

US 2003/0107414 A1 Jun. 12, 2003

(30) Foreign Application Priority Data

Dec. 7, 2001 (KR) ........................................ 2001-77410

(51) Int. Cl.[7] ................................................ H03B 1/00
(52) U.S. Cl. ........................ 327/108; 327/112; 327/391; 326/83
(58) Field of Search ........................ 327/108–112, 379, 327/389, 391, 170, 374, 376, 377, 544, 142, 198, 333; 326/57, 58, 81, 83, 26–28; 365/189.05, 226

(56) References Cited

U.S. PATENT DOCUMENTS

| | | | |
|---|---|---|---|
| 4,680,491 A | 7/1987 | Yokouchi et al. | |
| 5,338,978 A | 8/1994 | Larsen et al. | |
| 5,576,641 A | 11/1996 | Yoneya et al. | |
| 5,583,460 A | 12/1996 | Dohi et al. | |
| 5,604,710 A | 2/1997 | Tomishima et al. | |
| 5,680,071 A | 10/1997 | Senoh et al. | |
| 5,708,607 A | * 1/1998 | Lee et al. | 365/189.05 |
| 5,796,287 A | 8/1998 | Furutani et al. | |
| 6,147,924 A | 11/2000 | Lee et al. | |
| 6,166,561 A | * 12/2000 | Fifield et al. | 326/57 |
| 6,240,048 B1 | 5/2001 | Matsubara | |
| 6,376,869 B1 | 4/2002 | Tomita | |

FOREIGN PATENT DOCUMENTS

| | | |
|---|---|---|
| JP | 3283081 | 12/1991 |
| JP | 7153271 | 6/1995 |
| JP | 08-203270 | 8/1996 |
| JP | 9035498 | 2/1997 |
| JP | 8315567 | 9/1997 |
| JP | 10074395 | 3/1998 |
| JP | 11-066892 | 3/1999 |
| JP | 11-213666 | 8/1999 |
| JP | 11176158 | 12/1999 |
| JP | 2000067599 | 3/2000 |
| JP | 2000156084 | 4/2000 |
| JP | 2001057100 | 11/2001 |

* cited by examiner

*Primary Examiner*—Long Nguyen
(74) *Attorney, Agent, or Firm*—Marshall, Gerstein & Borun LLP

(57) ABSTRACT

A data output buffer is disclosed that is capable of reducing the power consumption of a circuit utilizing low power consumption in such a way that a data output buffer driver of the data output buffer is turned off to place a data output signal at a HIGH impedance state during a deep power mode wherein all internal supply voltages used are in an OFF state. Therefore, the data output buffer can prevent a data contention in a data bus and shut off a current path to prevent unnecessary power consumption.

2 Claims, 6 Drawing Sheets

DATA OUTPUT BUFFER

BACKGROUND OF THE INVENTION

1. Field of the Invention

A data output buffer and, more particularly, to a data output buffer capable of reducing the power consumption of a circuit is disclosed that uses low power, by turning off a data output buffer driver to make output data become a HIGH impedance in a deep power down mode.

2. Description of the Related Art

Generally, in memory devices such as DRAM, a data signal of a cell amplified by a bit line sense amplifier in a row address path is transmitted from a bit line to a data bus line when a column select signal outputted from a column decoder turns on a data bus line gate. Then, if the data is inputted to a data bus line sense amplifier, the data bus line sense amplifier is activated to amplify the data again and sends the data to a read driver. Only a read driver selected to a bit combination of the data output is activated so that data is transmitted to a data output buffer. The data output buffer is activated under the control of an output enable signal (OE: output enable) and a /CAS signal. The output path for the data is called a 'read path'. Of this output path, a dual data output buffer will be described in detail with reference to FIG. 1.

FIG. 1 is a circuit diagram of a conventional data output buffer.

The conventional data output buffer includes a driver driving control unit 10 for controlling an output of a data output driver 20. The data output driver 20 transmits read data to a data output terminal according to a control signal from the driver driving control unit 10.

The driver driving control unit 10 includes a first level shifter 11 and a first output control unit 12. First, the first level shifter 11 includes PMOS transistors P1 and P2 having a cross coupled structure and NMOS transistors N1 and N2 receiving an output enable signal OE and an output enable signal /OE inverted by an inverter IV1, respectively. Also, the first output control unit 12 includes an inverter IV2 for inverting an output control signal DOFFZ outputted from the first level shifter 11 to produce an output control signal DOFF.

The data output driver 20 includes a second level shifter 21, a third level shifter 22, a first pull-up control unit 23, a first pull-down control unit 24 and a first output driver 25. First, the second level shifter 21 includes PMOS transistors P3 and P4, NMOS transistors N3 and N4, and NMOS transistor N5. PMOS transistors P3 and P4 have a cross coupled structure, NMOS transistors N3 and N4 receive a data signal RDO and an inverted data signal /RDO inverted by an inverter IV3, and NMOS transistor N5 controls the output of the data signal RDO depending on the input of a pipe counter signal PCNT.

Also, the third level shifter 22 includes PMOS transistors P5 and P6, NMOS transistors N6 and N7, and NMOS transistor N8. PMOS transistors P5 and P6 have a cross coupled structure, NMOS transistors N6 and N7 receive the data signal RDO and an inverted data signal /RDO inverted by an inverter IV4, and a NMOS transistor N8 controls the output of the data signal RDO depending on an input of the pipe counter signal PCNT. The first pull-up control unit 23 includes a PMOS transistor P7 for outputting a pull-up signal depending on the output control signal DOFFZ applied from the first output control unit 12 of the driver driving control unit 10.

The first pull-down control unit 24 includes a NMOS transistor P9 for outputting a pull-down signal depending on the output control signal DOFF applied from the first output control unit 12 of the driver driving control unit 10. The first output driver 25 includes a PMOS transistor P8 and a NMOS transistor N10. The PMOS transistor P8 outputs the output data to a data output pin DQ depending on a pull-up signal UPZ applied from the pull-up control unit 20. Also, the NMOS transistor N10 outputs the output data to a data output pin DQ depending on a pull-down signal DN applied from the pull-down control unit 24.

An operation of the conventional data output buffer with this construction will be described with reference to the timing diagram of FIG. 2.

First, if a read command READ is inputted, the output enable signal OE becomes HIGH and the output of the first level shifter 12 becomes HIGH, so that the output control signal DOFFZ is inputted to the first output control unit 12. The first output control unit 12 inverts the output control signal DOFFZ using the inverter IV2 to produce the output control signal DOFF with a LOW level. The data signal RDO applied from the memory cell is applied to the data output terminal of the data output driver 20.

Next, during a NOP period where the read command READ is not applied, the output control signal DOFF becomes HIGH. The output of the first output driver 25 then moves to a HIGH impedance state.

Thereafter, when the semiconductor device is not driven, such as if a deep power down mode is set in order to reduce the power consumption, all internal supply voltages within the semiconductor memory device are not supplied. At this time, the levels of the output control signal DOFF and the output control signal DOFFZ, which control the output of the data output driver 20, become unstable. Therefore, the pull-up signal UPZ and the pull-down signal DN of the first pull-up control unit 23 and the first pull-down control unit 24, respectively, cannot maintain a stable level state.

In the case where an external power is used in the data output driver 20, and the pull-up signal UPZ becomes LOW, the output data becomes HIGH since the PMOS transistor P8 of the first output driver 25 is turned on (Case 1). Also, if the pull-down signal DN becomes HIGH, the output data becomes LOW since the NMOS transistor N10 of the first output driver 25 is turned on (Case 2). Further, if the pull-up signal UPZ is LOW and the pull-down signal DN is HIGH, since the PMOS transistor P8 and the NMOS transistor N10 are turned on (Case 3), a current path is formed at the output terminal of the output driver 25.

On the contrary, in the case where an internal power voltage is used in the data output driver 20, a current path is formed through the data bus line, the PMOS transistor P8 and the NMOS transistor N10 in the above mentioned Cases 1 and 2. Also, in the above Case 3, a current path is formed between the data bus line and the internal power voltage.

Upon initiation of a deep power down mode, it is required that the output data be kept to be a HIGH impedance. However, due to formation of the current path, the output data does not keep HIGH impedance and the output data is transmitted to the output terminal. As a result, current is consumed in the data bus line.

SUMMARY OF THE DISCLOSURE

The present disclosed apparatus reduces unnecessary power consumption by preventing a current path, thereby improving an output control unit for controlling a data output driver upon a deep power down mode to maintain a HIGH impedance.

A data output buffer is disclosed including a driver driving control unit configured to control an output of data depending on the a state of an output enable signal. The data output buffer also includes a data output driver configured to transmit the data to a data output terminal according to the driving control unit. The driver driving control unit also includes a level shifter for shifting the level of an input voltage depending on the output enable signal. The driver driving control unit also includes an output control unit for controlling the output of the data output driver to be placed in a high impedance state depending on the state of an output signal of the level shifter and a deep power down signal that is enabled upon initiation of a deep power down mode.

Further disclosed is a data output buffer comprising a driver driving control unit configured to output an output control signal to control an output of data depending on a state of an output enable signal. Further included is a data output driver configured to logically combine an output control signal from the driver driving control unit and the data signal and control an output terminal of the data to be placed in a high impedance state upon initiation of a deep power down mode depending on a state of a deep power down signal enabled upon initiation of the deep power down mode.

DETAILED DESCRIPTION OF PREFERRED EMBODIMENTS

Figure 1:
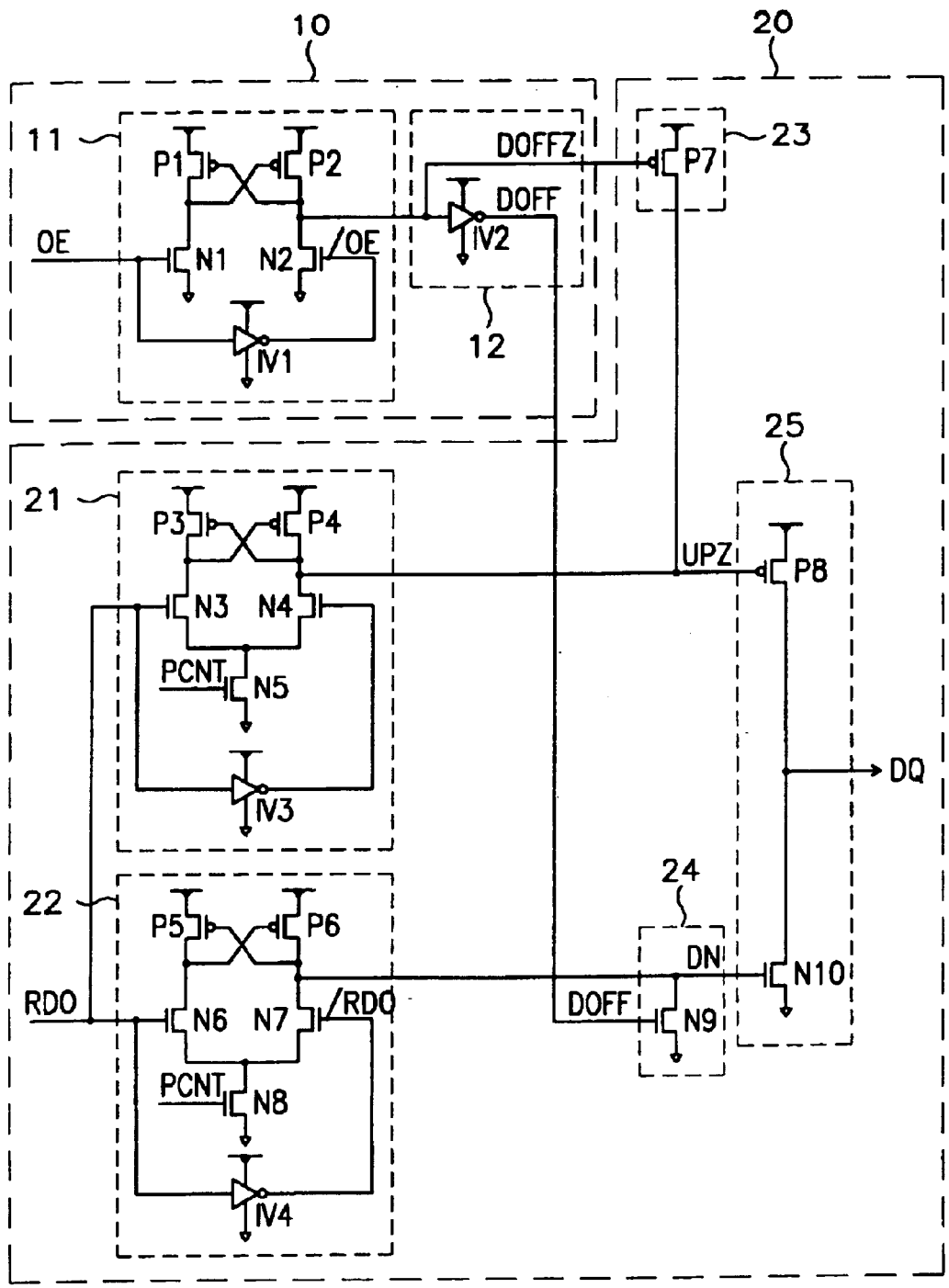
FIG. 1 is a circuit diagram of a conventional data output buffer.
Figure 2:
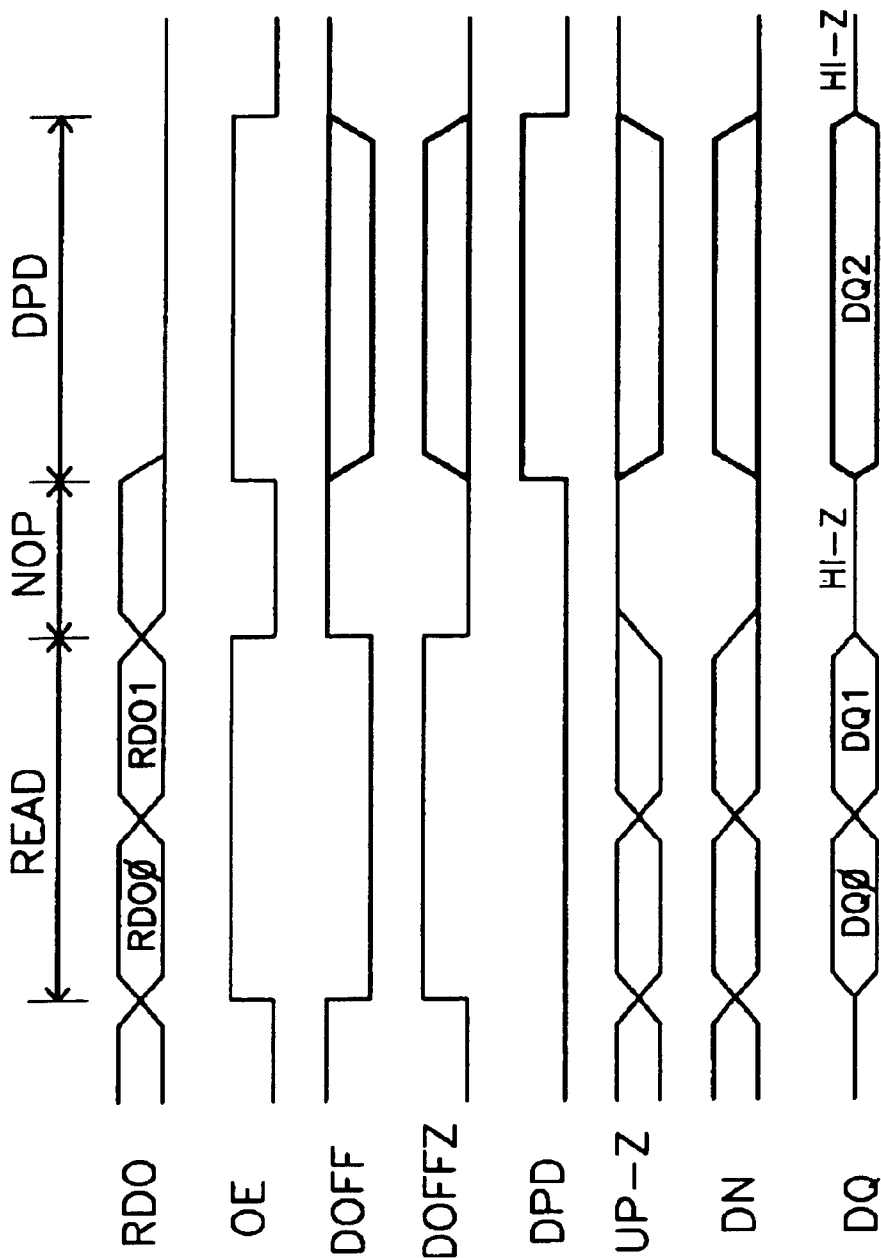
FIG. 2 is a timing diagram of the data output buffer in FIG. 1.
Figure 3:
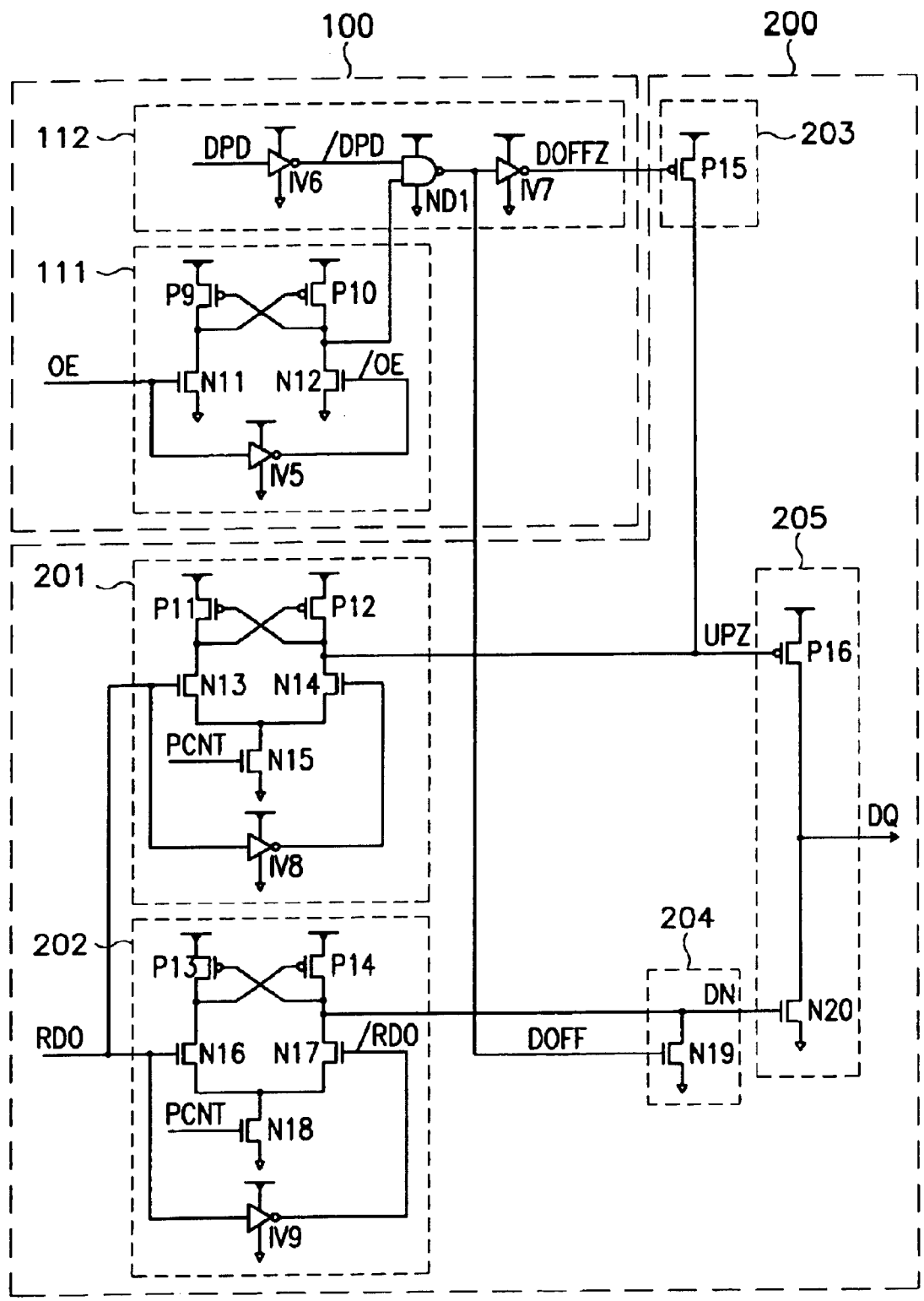
FIG. 3 is a circuit diagram of a data output buffer according to the present disclosed apparatus.

FIG. 3 is a circuit diagram of a data output buffer that includes a driver driving control unit 100 for controlling an output of a data output driver 200, which transmits read data to a data output terminal according to a control signal of the driver driving control unit 100.

The driver driving control unit 100 includes a fourth level shifter 111 and a second output control unit 112. Fourth level shifter 111 includes PMOS transistors P9 and P10 having a cross coupled structure and NMOS transistors N11 and N12 receiving an output enable signal OE and an inverted output enable signal /OE inverted by an inverter IV5, respectively. Also, the second output control unit 112 includes an inverter IV6, a NAND gate ND1 and an inverter IV7. An inverter IV6 inverts a deep power down signal DPD, a NAND gate ND1 performs a NAND logic function on an inverted deep power down signal /DPD inverted through an inverter IV6 and an output signal of the fourth level shifter 111 to produce an output control signal DOFF, and an inverter IV7 inverts an output control signal DOFF of the NAND gate ND1 to produce an output control signal DOFFZ. The second output control unit 112 for controlling an output of the data output driver 200 uses an external power voltage since all the internal power voltages are off upon a deep power down mode.

Further, the data output driver 200 includes a fifth level shifter 201, a sixth level shifter 202, a second pull-up control unit 203, a second pull-down control unit 204 and a second output driver 205. First, the fifth level shifter 201 includes PMOS transistors P11 and P12 having a cross coupled structure, NMOS transistors N13 and N14 for respectively receiving a data signal RDO and an inverted data signal /RDO inverted by an inverter IV8 and a NMOS transistor N15 for controlling the output of the data signal RDO depending on an input of a pipe counter signal PCNT. Also, the sixth level shifter 202 includes PMOS transistors P13 and P14 having a cross coupled structure, NMOS transistors N16 and N17 for respectively receiving the data signal RDO and the inverted data signal /RDO inverted by an inverter IV9 and a NMOS transistor N18 for controlling an output of the data signal RDO depending on an input of the pipe counter signal PCNT. The second pull-up control unit 203 includes a PMOS transistor P15 for outputting a pull-up signal UPZ depending on the output control signal DOFFZ applied from the second output control unit 112 in the driver driving control unit 100. The second pull-down control unit 204 includes a NMOS transistor P19 for outputting a pull-down signal DN depending on the output control signal DOFF applied from the second output control unit 112 in the driver driving control unit 100. The second output driver 205 includes a PMOS transistor P16 and a NMOS transistor N20, and receives the pull-up signal UPZ and the pull-down signal DN to output an output data.

Figure 4:
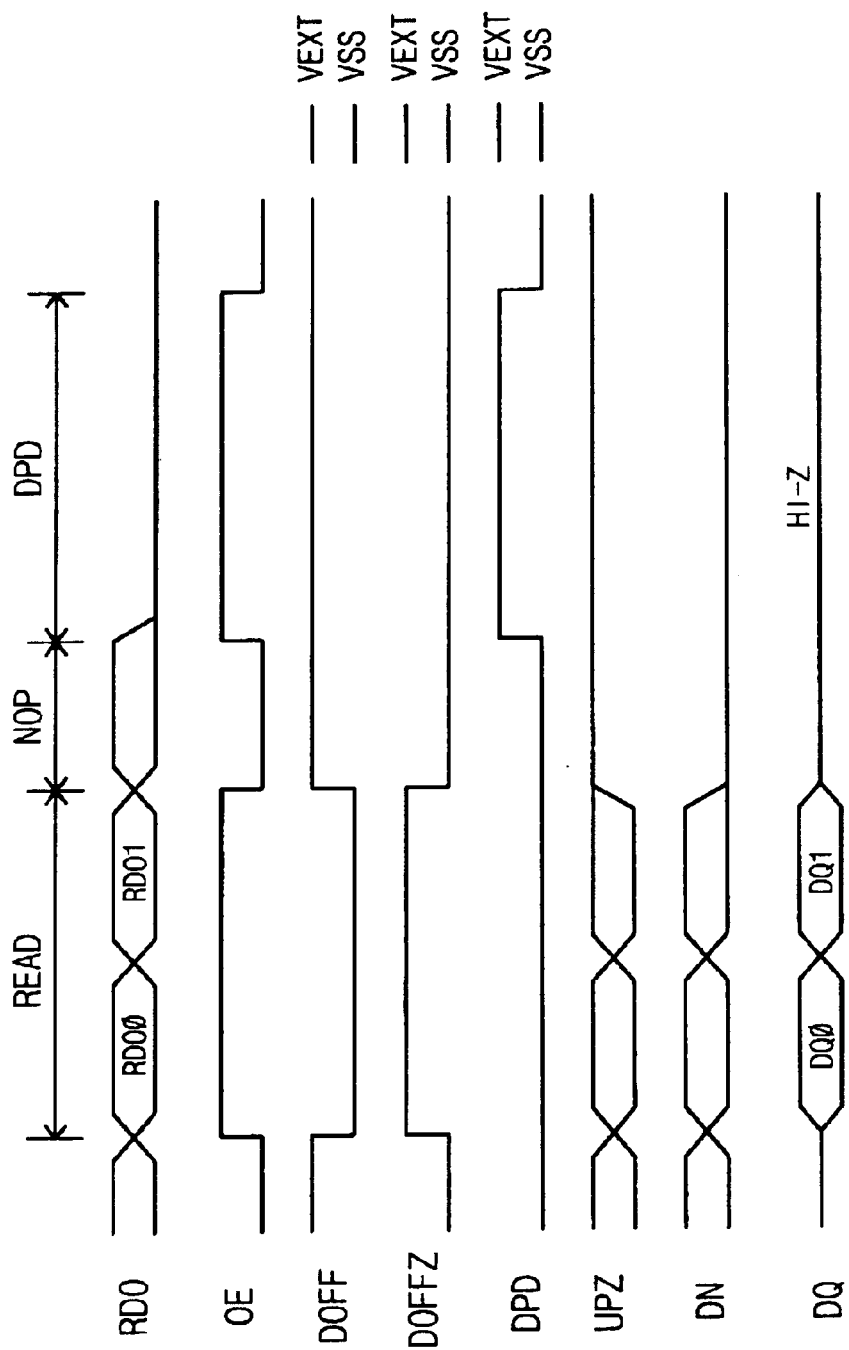
FIG. 4 is a timing diagram of the data output buffer illustrated in FIG. 3.

An operation of the data output buffer having the construction illustrated in FIG. 3 will be described with reference to the timing diagram of FIG. 4.

First, in the case where the data output buffer is not the deep power down mode, and a read command READ is inputted, the output enable signal OE is enabled to be HIGH and the output of the fourth level shifter 111 becomes a HIGH level. Also, in the case where the data output buffer is in the deep power down mode, the deep power down signal DPD enabled to be HIGH is inputted with LOW and is then inverted by the inverter IV6 so that a signal of HIGH is inputted to the NAND gate ND1. The NAND gate ND1 in the second output control unit 112 performs a NAND logic function on the signals from the fourth level shifter 111 and the inverter IV6 to produce the output control signal DOFF with a LOW level. The output control signal DOFF is inputted to the inverter IV7 and the output control signal DOFFZ becomes a HIGH level. Therefore, the second pull-up unit 203 and the second pull-down unit 204 in the data output driver 200 are turned off depending on the output control signal DOFF and the output control signal DOFFZ. Also, the data signal RDO applied from a memory cell of a semiconductor device is applied to the output driver 205 through the fifth level shifter 201 and the sixth level shifter 202, respectively, so that data is outputted by the output driver 205.

Further, in the case where the data output buffer is not the deep power down mode, the deep power down signal DPD is inputted with LOW and a signal of HIGH inverted by the inverter IV6 is inputted to the NAND gate ND1. Also, in case of NOP, when a command that does not include a read is inputted, the output enable signal OE is disabled to be LOW so that the output of the fourth level shifter 111 with a LOW level is inputted to the NAND gate ND1 of the second output control unit 112. Due to this operation, the NAND gate ND1 outputs a HIGH signal as the output control signal DOFF and the output control signal DOFFZ becomes LOW by the inverter IV7. Therefore, a LOW signal is inputted to the second pull-up unit 203 in the data output driver 200 and a HIGH signal is inputted to the second pull-down unit 204, so that the pull-up signal UPZ and the pull-down signal DN are inputted with HIGH and LOW, respectively. As a result, the PMOS transistor P16 and the NMOS transistor N20 in the output driver 205 are turned off so that the output data becomes a HIGH impedance state.

Meanwhile, when the data output buffer is set into the deep power down mode, all the internal power voltages become off. If the deep power down signal DPD is enabled to HIGH, a LOW signal is applied to the NAND gate ND1 via the inverter IV6. Therefore, the NAND gate ND1 outputs a HIGH signal as the output control signal DOFF and the output control signal DOFFZ is inverted by the inverter IV7, which is then outputted as a LOW level. If the output control signal DOFF and the output control signal DOFFZ in the second output control unit 112 become HIGH and LOW respectively, the PMOS transistor P15 and the NMOS transistor N19 in the second pull-up control unit 203 and the second pull-down control unit 204 are turned on. If the pull-up signal UPZ having a HIGH level is inputted to the PMOS transistor P16 of the output driver 205 and a pull-down signal DN having a LOW level is inputted to the NMOS transistor N20 of the output driver 205, the PMOS transistor P16 and the NMOS transistor N20 are all turned off. Therefore, upon a deep power down mode, it is possible to maintain the output of the output driver 205 at a HIGH impedance state. As a result, upon a deep power down mode, it is possible to prevent the generation of unnecessary output data, thereby reducing consumption of current.

Figure 5:
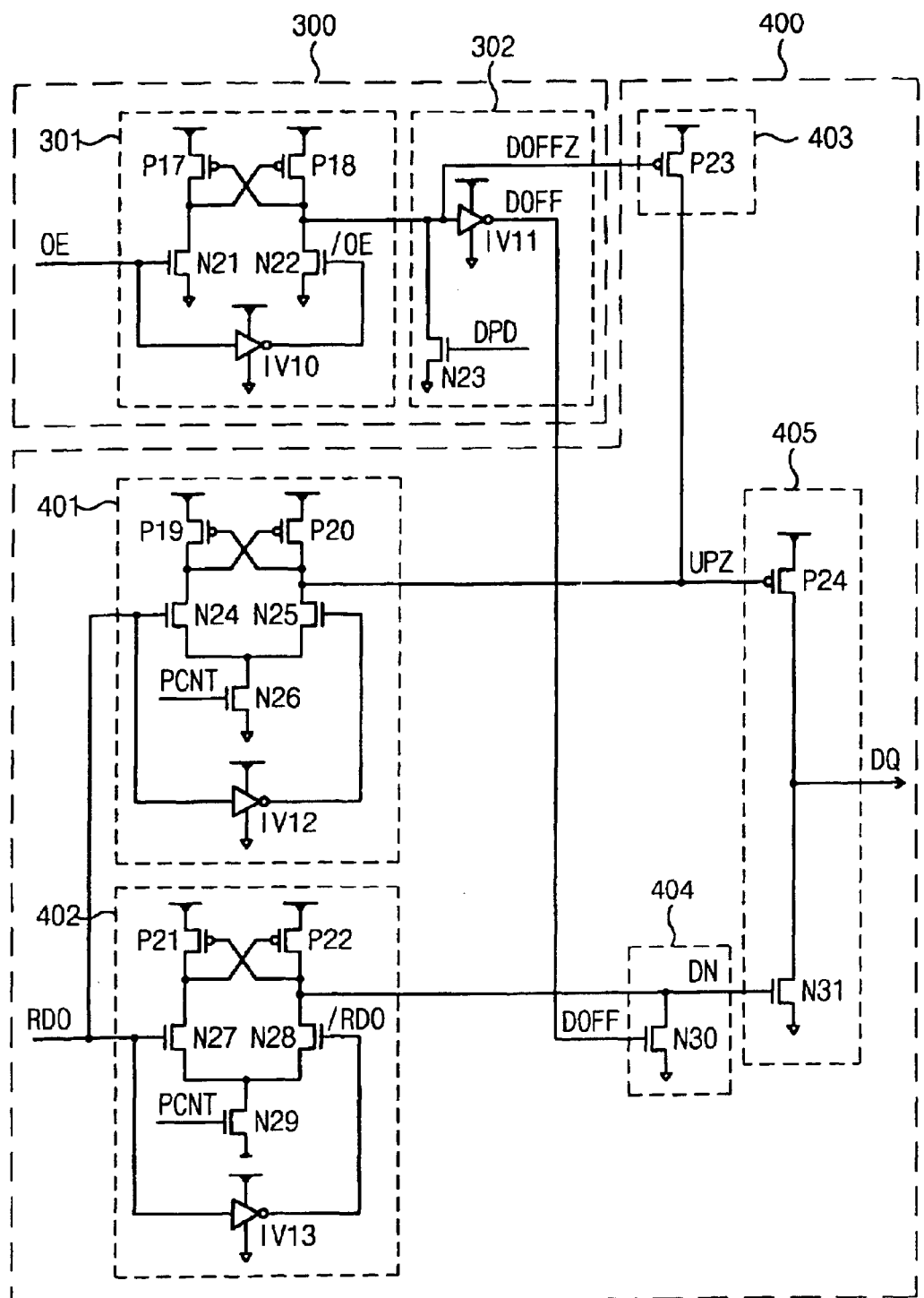
FIG. 5 is a circuit diagram of a data output buffer according to another embodiment of the present disclosure.

FIG. 5 is a circuit diagram of a data output buffer according to another embodiment of the disclosure.

The data output buffer of FIG. 5 includes a driver driving control unit 300 for controlling an output of a data output driver 400, which transmits read data to a data output terminal depending on a control signal of the driver driving control unit 300. The driver driving control unit 300 includes a seventh level shifter 301 and a third output control unit 302. First, the seventh level shifter 301 includes PMOS transistors P17 and P18 having a cross coupled structure, and NMOS transistors N21 and N22 for respectively receiving an output enable signal OE and an output enable signal /OE inverted by an inverter IV10. Also, the third output control unit 302 includes a NMOS transistor N23 and an inverter IV11 connected between an output terminal of a seventh level shifter 301 and ground. The NMOS transistor N23 receives a deep power down signal DPD through its gate, and an inverter IV11 inverts an output control signal DOFFZ from the seventh level shifter 301 to produce an output control signal DOFF.

Further, the data output driver 400 includes an eighth level shifter 401, a ninth level shifter 402, a third pull-up control unit 403, a third pull-down control unit 404 and a third output driver 405. First, the eighth level shifter 401 includes PMOS transistors P19 and P20 having a cross coupled structure, NMOS transistors N24 and N25 for respectively receiving the data signal RDO and an inverted data signal /RDO inverted by an inverter IV12 and a NMOS transistor N26 for controlling the output of the data signal RDO depending on an input of the pipe counter signal PCNT. Also, the ninth level shifter 402 includes PMOS transistors P21 and P22 having a cross coupled structure, NMOS transistors N27 and N28 for respectively receiving the data signal RDO and an inverted data signal /RDO inverted by an inverter IV13 and a NMOS transistor N29 for controlling the output of the data signal RDO depending on an input of the pipe counter signal PCNT. The third pull-up control unit 403 includes a PMOS transistor P23 for outputting a pull-up signal UPZ depending on an output control signal DOFFZ applied from the third output control unit 302 of the driver driving control unit 300. The third pull-down control unit 404 includes a NMOS transistor P30 for outputting a pull-down signal DN depending on the output control signal DOFF applied from the third output control unit 302 of the driver driving control unit 300. The third output driver 405 includes a PMOS transistor P24 and a NMOS transistor N31 both of which are serially connected between the power voltage terminal and the ground voltage terminal. And PMOS transistor P24 receives the pull-up signal UPZ and A NMOS transistor N31 receives the pull-down signal DN to produce an output data.

In the data output buffer having the construction of FIG. 5, the deep power down signal DPD is enabled to be HIGH so that the NMOS transistor N23 is turned on, upon the deep power down mode. At this time, the output control signal DOFFZ is disabled to be at a LOW level and the output control signal DOFF is enabled to be at a HIGH level by the inverter IV11. Also, if a LOW level signal is inputted to the third pull-up unit 403, the PMOS transistor P23 is turned on. Further, if a HIGH level signal is inputted to the third pull-down unit 404, the NMOS transistor N30 is turned on. As a result, the PMOS transistor P24 and the NMOS transistor N31 in the output driver 405 are turned off by the pull-up signal UPZ and the pull-down signal DN so that the output of the output driver 405 can be maintained at a HIGH impedance state during the deep power down mode.

Figure 6:
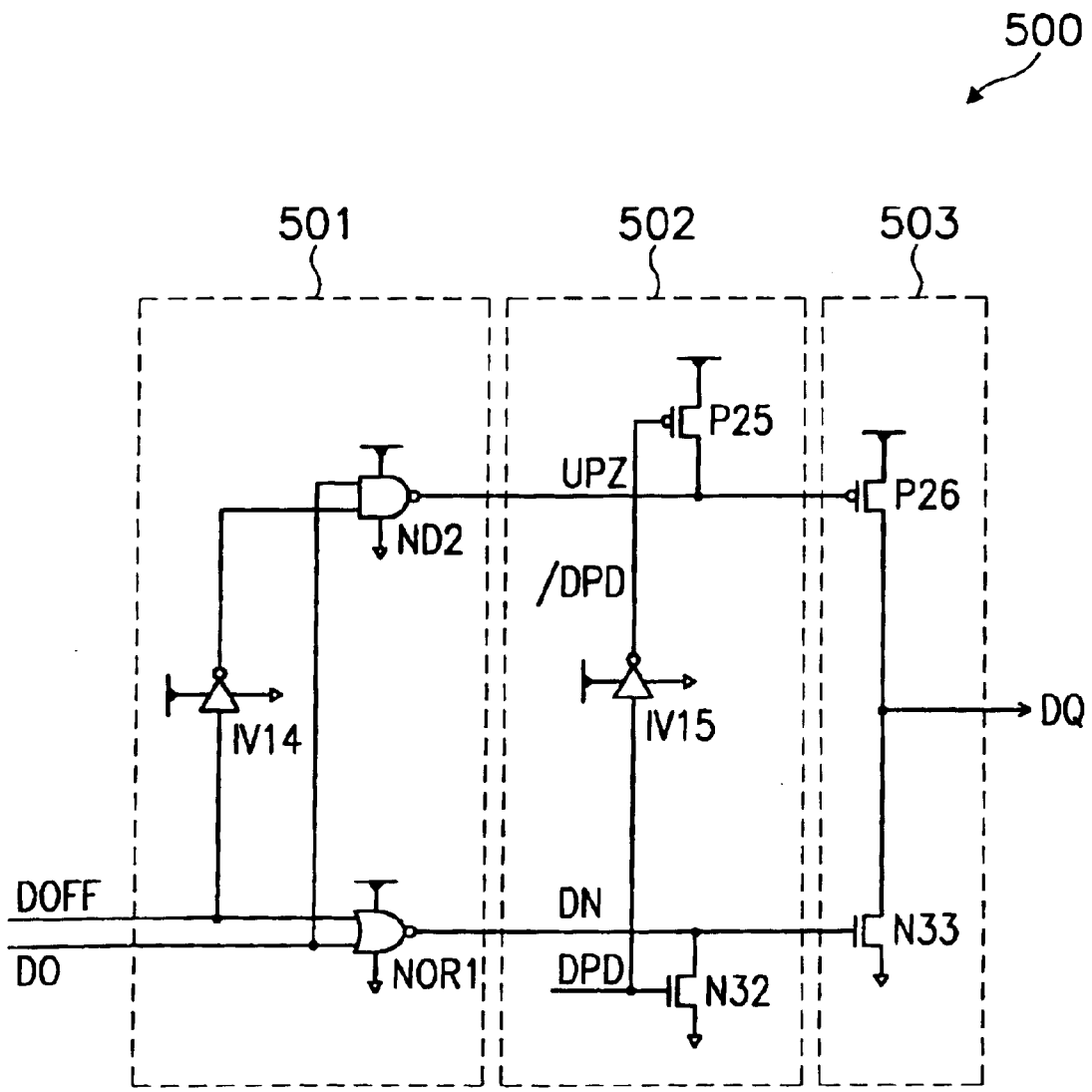
FIG. 6 is a circuit diagram of a data output buffer according to still another embodiment of the present disclosure.

FIG. 6 is a circuit diagram of a data output buffer according to still another embodiment of the disclosure.

The data output driver 500 of FIG. 6 includes a logic unit 501, a fourth output control unit 502 and a fourth output driver 503. A logic unit 501 logically combines the output control signal DOFF and the data signal DO to output the pull-up signal UPZ and the pull-down signal DN, a fourth output control unit 502 controls the output of the output driver 503 depending on the pull-up signal UPZ and the pull-down signal DN applied from the logic unit 501, and the deep power down signal DPD, and a fourth output driver 503 controls the output of the output data depending on a control signal from the fourth output control unit 502.

The logic unit 501 includes an inverter IV14, a NAND gate ND2 and a NOR gate NOR1. The inverter IV14 inverts an output control signal DOFF, a NAND gate ND2 performs a NAND logic function on a signal applied from the inverter IV14 and the data signal DO to output a pull-up signal UPZ, and a NOR gate NOR1 performs a NOR logic function on the output control signal DOFF and the data signal DO to output a pull-down signal DN.

Also, the fourth output control unit 502 includes an inverter IV15, a PMOS transistor P25 and a NMOS transistor N32. The inverter IV15 inverts the deep power down signal DPD. A PMOS transistor P25 is connected between the power voltage terminal and the output terminal of the NAND gate ND2 and has a gate to which is inputted an inverted deep power down signal /DPD. NMOS transistor N32 is connected between an output terminal of the NOR gate NOR1 and a ground voltage terminal and has a gate to which is inputted the deep power down signal DPD.

Further, the fourth output driver 503 includes a PMOS transistor P26 and a NMOS transistor N33 serially connected between the power voltage terminal and the ground voltage terminal. The fourth output driver 503 receives the pull-up signal UPZ and the pull-down signal DN from the fourth output control unit 502 via a gate of PMOS transistor P26 and a gate of NMOS transistor N33, respectively, to produce an output data.

The logic unit 501 with the above-described construction outputs the pull-up signal UPZ and the pull-down signal DN due to a logic combination of the output control signal DOFF and the data signal DO. Upon a deep power down mode, the deep power down signal DPD is enabled to be HIGH. Thus, the NMOS transistor N32 in the fourth output control unit 502 is turned on and the PMOS transistor P25 is turned off by the inverted deep power down signal /DPD inverted by the inverter IV15. Therefore, a HIGH signal is inputted to the PMOS transistor N26 of the output driver 503 and a LOW signal is inputted to the NMOS transistor N33 so that the output data can be kept at a HIGH impedance state.

As mentioned above, according to the present disclosure, the final driver of a data output driver is placed in an OFF state in a deep power down mode wherein all power voltage devices internally used are in OFF states in order to reduce the power consumption in a device using a low power. Therefore, the presently disclosed devices can prevent a data problem at a data output terminal by placing the output data at a HIGH impedance state and prevent unnecessary power consumption by preventing a formation of a current path.

While the data output buffers have been explained with respect to particular examples, it will be apparent to those of ordinary skill in the art that the scope of this patent is not limited to those examples. On the contrary, this patent covers all apparatuses and methods falling within the spirit and scope of the appended claims, either literally or under the doctrine of equivalents.

What is claimed is:

1. A data output buffer comprising:
    a driver driving control unit configured to control an output of a data output driver depending on a state of an output enable signal; and
    the data output driver configured to transmit a read data applied from a data bus line the driver driving control unit,
    wherein the driver driving control unit includes:
        a level shifter for receiving the output enabled signal and generating a level shifter's output signal; and
        an output control unit comprising a logic unit for performing a logic function on the output signal of the level shifter and a deep power down signal that is enabled in a deep power down mode, the output control unit controlling the output signal of the data output driver to be placed in a HIGH impedance state in the deep power down mode.

2. The data output buffer according to claim 1, wherein the logic unit comprises:
    a first inverter for inverting the deep power down signal;
    a NAND gate for performing a NAND logic function on the deep power down signal inverted through the first inverter and the output signal of the level shifter; and
    a second inverter for inverting an output control signal of the NAND gate to output a second output control signal.

* * * * *

UNITED STATES PATENT AND TRADEMARK OFFICE
CERTIFICATE OF CORRECTION

PATENT NO. : 6,720,802 B2
DATED : April 13, 2004
INVENTOR(S) : Ho Y. Cho

It is certified that error appears in the above-identified patent and that said Letters Patent is hereby corrected as shown below:

Column 8,
Line 7, please delete "data bus line the driver" and replace with -- data bus line to the driver --.
Line 25, please delete "output control signal" and replace with -- output signal --.

Signed and Sealed this

Twenty-first Day of December, 2004

JON W. DUDAS
*Director of the United States Patent and Trademark Office*